United States Patent [19]

Wills

[11] 4,146,085
[45] Mar. 27, 1979

[54] DIAGNOSTIC SYSTEM FOR HEAT PUMP

[75] Inventor: Frank E. Wills, York, Pa.

[73] Assignee: Borg-Warner Corporation, Chicago, Ill.

[21] Appl. No.: 839,084

[22] Filed: Oct. 3, 1977

[51] Int. Cl.² .......................................... G01M 19/00
[52] U.S. Cl. .................................. 165/11; 62/127; 236/94; 324/73 R
[58] Field of Search ................ 62/125, 126, 127, 129; 236/94; 165/11; 324/73 R

[56] References Cited

U.S. PATENT DOCUMENTS

| | | | |
|---|---|---|---|
| 3,667,037 | 5/1972 | Kierce | 324/73 R |
| 3,736,765 | 6/1973 | O'Dell | 62/125 |
| 3,890,836 | 6/1975 | McKenzie et al. | 165/11 |
| 4,087,046 | 5/1978 | Borucki et al. | 236/11 |

Primary Examiner—Stuart N. Hecker
Attorney, Agent, or Firm—James J. Jennings, Jr.

[57] ABSTRACT

A diagnostic system is provided for apparatus including a heat pump, a thermostat and a logic module intercoupled to regulate operation of the heat pump electromechanical units. The normal control and operating circuits for the heat pump are completed over a wiring harness plugged into an electrical connector on the logic module, which also receives a plurality of sensor information inputs. To check the system, the diagnostic system has a first cable terminating in an interconnector, inserted between the electrical connector on the module and the harness plug. The sensor inputs are disconnected, and additional connectors, carried in a second cable of the diagnostic system, are coupled to the sensor input connections on the logic module. When thus connected, the diagnostic system monitors operation of the thermostat, even though the module is removed at a considerable distance from the thermostat, and also actuates the heat pump units to check their operation. An ohmmeter is included in the diagnostic system, to measure the resistance of the various sensors, and provide an indication of the temperature at a given sensor location. With this diagnostic system, the thermostat, logic module and heat pump units are all rapidly checked from a single location.

15 Claims, 9 Drawing Figures

DIAGNOSTIC SYSTEM FOR HEAT PUMP

BACKGROUND OF THE INVENTION

Environmental control apparatus of the type generally referred to as a heat pump has been known and utilized for some time. In general, such units include a condensor and an evaporator, connected in the system as a normal cooling system would be oriented. However, the heat pump generally comprises a reversing valve, connected to change the output connection from the compressor discharge line, so that it can supply either the indoor coil or the outdoor coil. This changes the operation or function of those coils between the condensor and evaporator function, and thus is able to change the system from a heating to a cooling system, and vice versa. As the cost of energy has risen very rapidly in recent years, heat pumps have been employed more frequently and considerable attention has been given to upgrading the control of such systems.

A significant advance in the area of heat pump controls is described and claimed in the application entitled "Heat Pump Control System", in the name of Frank Eugene Wills, which was filed Oct. 15, 1976, received Ser. No. 732,674, now U.S. Pat. No. 4,102,389, and is assigned to the assignee of this application. In that system, most of the controls were located in a single logic module, physically positioned in the heat pump installation where the electromechanical units of the heat pump are positioned. That is, the heat pump actuators such as the defrost relay, the compressor relay (sometimes termed a compressor contactor), and the electric heat sequencers are the electro mechanical units regulated by the output signals from the logic module. Even with this salutary advance in the heat pump art, there are still mechanical and/or electrical malfunctions of equipment which require diagnosis by a trained service technician. In addition it frequently happens that a thermostat may be improperly installed, or the interconnecting wiring between the thermostat and the logic module is improperly installed. For these reasons, it is desirable to have a diagnostic system which readily and accurately detects any system malfunctions, whether in the equipment installation or in subsequent wear of the system.

It is therefore a primary object of the present invention to provide a diagnostic system for use with the heat pump control system, which can effect all the diagnostic operations from a single location.

A more particular object of the present invention is to provide such a diagnostic system which not only analyzes the thermostat, module and heat pump components, but also draws power for its own operation from the system under test.

SUMMARY OF THE INVENTION

A diagnostic system constructed in accordance with the present invention is useful with an environmental control apparatus of the type which includes a heat pump having electromechanical units, and a thermostat and logic module are interconnected with the heat pump units. The logic module has a first set of electrical contacts coupled over interconnecting wiring both to the thermostat and the electro-mechanical units of the heat pump. The diagnostic system comprises electrical interconnection means constructed for coupling to the first set of electrical contacts in the logic module, and a plurality of indicator lamps coupled to these interconnection means. Illumination of these lamps indicates the status of the thermostat, and of the interconnecting wiring between the thermostat and the logic module, for diagnostic purposes.

In accordance with another feature of the invention, the diagnostic apparatus comprises additional indicator lamps to denote energization of the different electric heat units associated with the heat pump.

In accordance with another feature of the invention, the diagnostic system comprises a plurality of multiposition switches intercoupled with the electrical interconnection means. By selectively actuating these switches, the individual units within the heat pump are individually cycled to check their operation. The switches can be positioned to cycle a given electro-mechanical unit, or to let such unit operate normally in connection with the signal received from the logic module, or to block such unit from operation.

In accordance with another feature of the invention, the diagnostic system of the invention may include at least one additional switch, connected to send a signal to the logic module to regulate a function such as the defrost cycle, or selective energization of the compressor, and/or electric heat functions.

Another important feature of the invention is the provision of a second electrical interconnection means on the diagnostic system for coupling to a second set of electrical contacts on the logic module, which contacts would otherwise receive sensor input signals. An ohmmeter is provided in the diagnostic system to display information for monitoring operation of the logic module and the sensors normally connected to the second set of electrical contacts.

THE DRAWINGS

In the several figures of the drawings, like reference numerals identify like components, and in those drawings.

GENERAL BACKGROUND DESCRIPTION

To appreciate the unobviousness and understand the utilization of the present invention, it will be helpful to provide a background of a general heat pump arrangement, as well as the interconnection of the heat pump electro-mechanical units with a logic module and a room thermostat. Such background information is set out in detail in the above identified earlier application. However, to simplify the teaching of the present invention for those skilled in the art, such a description will now be set out in connection with FIGS. 1 and 2 of this application.

Figure 1:
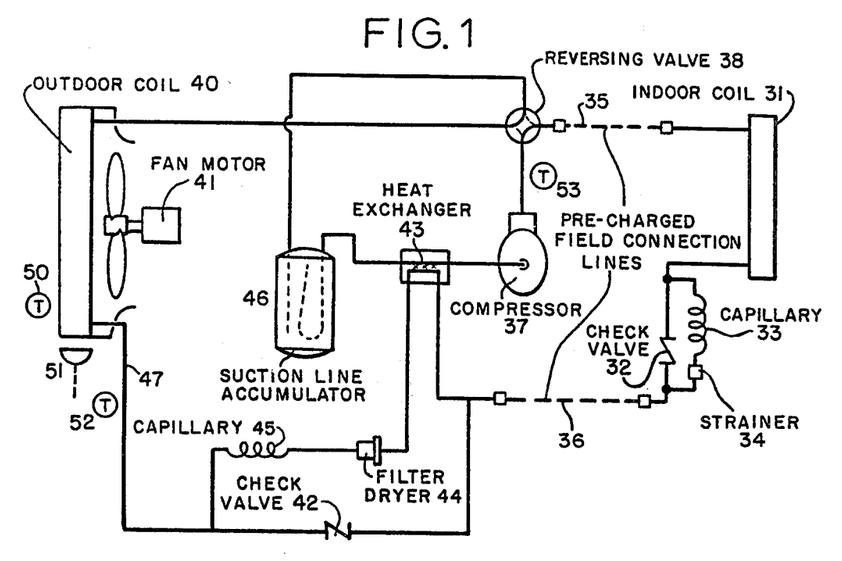
FIG. 1 is a block diagram of a heat pump arrangement.

FIG. 1 depicts major components of a heat pump system for either heating or cooling a space as heat is extracted from or pumped into an indoor coil 31. Also at the indoor location is a check valve 32. A capillary tube 33 is coupled in series with a strainer 34; the capillary and strainer effectively bypass the check valve. The indoor equipment is connected over a pair of precharged field connection lines 35, 36 with the remaining equipment.

A compressor 37 has its discharge line coupled to one side of a reversing valve 38, which as illustrated is positioned for the heating cycle flow. An outdoor coil 40 and an outdoor fan with a motor 41 are positioned to extract heat from, or discharge heat into, the outdoor air. In the illustrated heating position, with the indoor coil functioning as a condenser, the liquid returning through check valve 32 and line 36 is blocked by check valve 42, but passes through heat exchanger 43, filter-dryer 44 and capillary line 45 to the outdoor coil 40, which functions as the evaporator on the heating cycle. The low-pressure gas is then returned from the outdoor coil 40 over reversing valve 38, suction line accumulator 46, and heat exchanger 43 to the low pressure side of compressor 37.

To effect cooling, reversing valve 38 is repositioned to discharge the high-pressure gas through outdoor coil 40, which now operates as the condenser. The liquid is returned through check valve 42, line 36, strainer 34 and capillary 33 to the indoor coil 31, which now operates as the evaporator. The low-pressure gas from coil 31 is then returned over line 35, reversing valve 38, accumulator 46 and heat exchager 43 to compressor 37.

The control system for the illustrated heat pump includes particular data sensors, such as a sensor or thermistor 50 positioned adjacent outdoor coil 40 to sense the ambient temperature of the outdoor atmosphere. A pressure differential switch 51 is also positioned adjacent coil 40 to sense the difference in the air pressure across the outdoor coil. Another temperature sensor 52, which can be another thermistor, is positioned adjacent the line 47 to sense the temperature of the liquid in the line. Another thermistor or temperature sensor 53 is positioned as shown for providing a signal which varies as the temperature in the discharge line of the compressor. It is emphasized that this thermistor 53 provides information in addition to that provided by the usual high-pressure cut-out switch (which will be described in connection with FIG. 2), and thus is not a substitute for the information normally derived from that switch.

Figure 2:
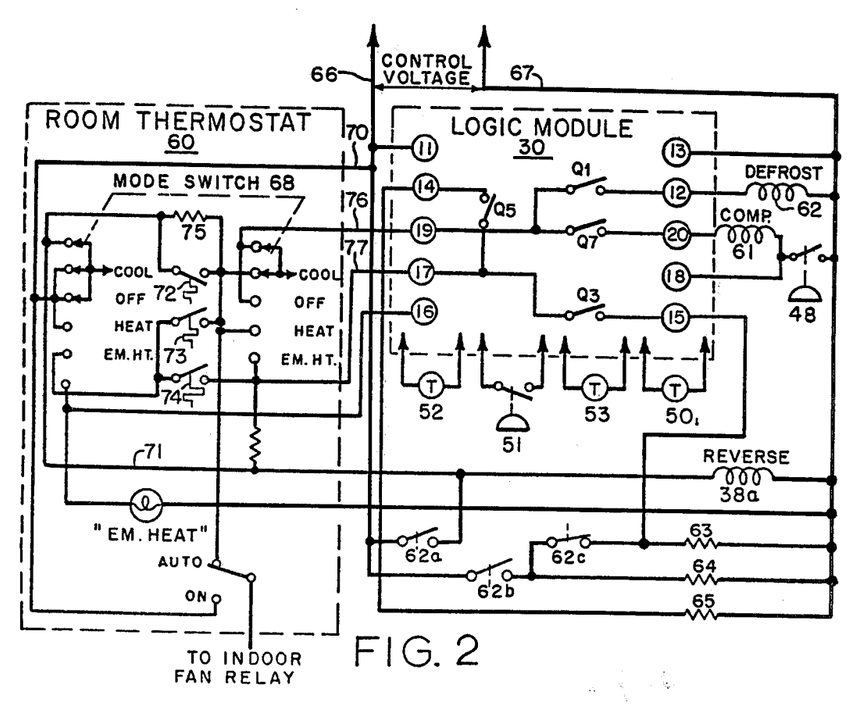
FIG. 2 is a schematic diagram of a room thermostat and logic module interconnected to regulate the electro-mechanical units of a heat pump.

FIG. 2 indicates the general interconnection of a logic module 30, a major component of the control system used with the heat pump, with the just-described sensors 50–53, and a room thermostat 60, which in this embodiment is of the manual change-over type. Logic module 30 includes a plurality of terminals numbered 11–20, the better to correlate the general showing of FIG. 2 with the subsequent description of the diagnostic system of this invention. At the right side of FIG. 2 the usual high-pressure cut-out switch 48 for the compressor discharge line is shown, to emphasize that temperature sensor 53 provides information different than, and in addition to, that available from the cut-out switch 48.

Within the logic module are four "switches" Q1, Q3, Q5, and Q7. Although represented as simple mechanical switches, in the embodiment described in the earlier application the switches were triacs for passing current in either direction in response to application of a suitable gate signal and potential difference across the triac. Winding 61 is the winding of a "compressor run" relay, so that when winding 61 is energized a contact set (not shown) is closed to complete an energizing circuit for the compressor motor. Similarly winding 62 is the operating part of a "defrost" relay which, when energized, opens a normally-closed contact set (not shown) for the outdoor fan motor 41 (FIG. 1) to prevent operation of the condenser fan motor in the defrost cycle. In addition actuation of the defrost relay closes the normally closed contact set 62c. The elements 63, 64 and 65 shown as simple resistors, are heating components used in the supplemental and standby heating as will be explained hereinafter.

In general a control voltage of 24 volts is provided across the conductors 66 and 67 to energize the control system of this invention. In the showing of FIG. 2, mode switch 68 of the room thermostat is in the "cool" position. In this position a circuit is completed from line 66 over line 70, the upper left contacts of the mode switch, and line 71 to one side of winding 38a for actuating reversing valve 38; the other side of this winding is coupled to line 67. Thus in the cooling position of the mode switch the reversing valve 38 is actuated to the position opposite that shown in FIG. 1.

Considering FIG. 2 again, it is evident that if switch Q7 is closed with the thermostat mode switch 68 in the illustrated "cool" position, and high-pressure cut-out switch 48 is closed indicating the compressor discharge pressure is below a predetermined cut-out value, an energizing circuit is completed for the compressor relay winding 61. This circuit extends from conductor 66 over conductor 70, the switches at the upper left of the mode switch, the cooling stage contacts 72 (which are in parallel with the heat and cool anticipation resistor 75), the upper right contacts of the mode switch, conductor 76, terminal 19 of the logic module, Q7, terminal 20, winding 61 and contact set 48 to conductor 67. Thus the compressor motor will be energized and the compressor will be driven when the mode switch 68 is in the cool position and contact set 72 is closed. If the switch Q7 is open, then the compressor motor relay winding 61 cannot be energized. It is also apparent that if the mode switch 68 is displaced downwardly into the "heat" position, an energizing circuit for relay winding 61 can be completed over the first heating stage contacts 73.

From the foregoing it is apparent that the potential on conductor 66 can be extended over conductor 70 and the thermostat contacts to terminal 19 of the logic module 30. It is further apparent that if switch Q1 is closed, this will complete a circuit over terminal 12 of the logic module to the left side of defrost initiate relay winding 62, the other side of which is coupled to conductor 67. For the present it is sufficient to note that the closure of switch Q1 in effect initiates the defrost cycle of the equipment.

In general the other switches Q3 and Q5 are used to regulate the supplementary and standby heating functions. Considering switch Q3, this switch is closed in the event the system is calling for heat and the heat pump is not able to supply the amount of heat necessary to warm the interior space. With the mode switch 68 in the heat position, it is apparent that the circuit previously established over line 71 to the reverse winding 38a is interrupted. If the system is in the heating mode, and switch Q3 is closed, a circuit is completed over conductor 66, conductor 70, the lower left contacts of the mode switch 68, and second stage thermostat contacts 74, conductor 77, terminal 17 of the logic module 30, switch Q3, terminal 15, and resistor 63 to the conductor 67. Although depicted as a simple resistance 63, this symbol actually represents a heat sequencing system where, as current continues to pass through the sequencer, electric heating is brought on in approximately five kilowatt steps to augment the heat being supplied by the heat pump system. Such supplemental heat is normally provided in increments, such as five kilowatt increments, to preclude the placing of a large load instantly on the power distribution system. This is also helpful when the system is shut down and recycled after a power interruption, as it militates against a larger number of loads being thrown simultaneously on the line which might cause an overload and another interruption of power.

One way to bring on the lowermost heating unit 65 is to displace the mode switch 68 downwardly into the emergency heat position and close the switch Q5 in the logic module 30. When both these conditions are present, the circuit from conductor 66 is extended over conductor 70, the lower left set of contacts of the mode switch, and the emergency heat lamp to conductor 67. In addition, in parallel with the emergency heat indicator, the circuit is extended as previously over the second stage thermostat 74 and conductor 77 to terminal 17 of the logic module. When Q5 is closed, this completes the circuit over Q5, terminal 14 and resistance element 65 to conductor 67, to energize the standby (emergency) heat. Heating element 65 can also be energized automatically, for example, when an outside temperature of −10° F. or less is sensed.

Figure 3:
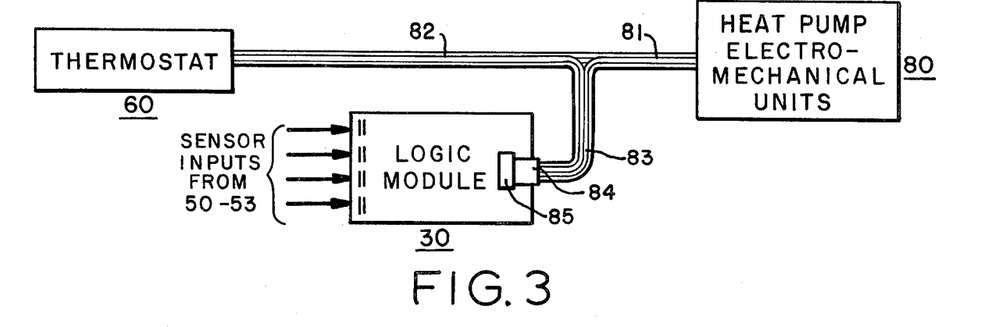
FIG. 3 is a block diagram depicting the interconnection of a thermostat, logic module, and heat pump electromechanical components in a known system.

FIG. 3 is a general showing of the intercoupling between thermostat 50 and logic module 30, together with the heat pump electro-mechanical units (such as the defrost relay winding 62, compressor winding 61, and the standby and supplementary heat units). These electro-mechanical units are not shown individually, but are collectively represented by box 80. The electrical conductors from the several electromechanical units are gathered together in a cable 81, and in a similar manner the wiring from thermostat 60 is enclosed within a corresponding cable 82. These two cables are joined in a common cable 83 with all the interconnecting wiring, and this cable is terminted in a connector plug 84. A receptacle 85 on logic module 30 includes a first set of electrical contacts which, when the receptacle is mated with the plug 84, establishes continuity between the circuits on the logic module 30 and the circuits in thermostat 60 and the logic module units 80.

Figure 4:
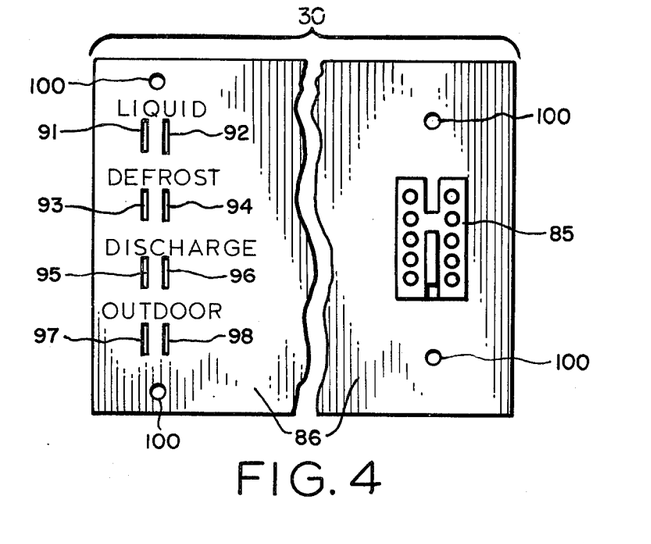
FIG. 4 is a plan view of a portion of a logic module, depicting a first electrical interconnector and a second set of electrical connector contacts.

FIG. 4 indicates that logic module 30 includes a conventional circuit board portion 86, and the receptacle 85 is shown at the right end of this board. At the left end are four pairs of contacts for receiving push-type electrical connectors. The contacts 91,92 marked "liquid" are those for connection to the thermistor 52, providing an electrical signal from thermistor 52 which varies as a function of the temperature in line 47. The "defrost" contacts 93,94 are those connected to the terminals from the pressure differential switch 51 which as noted above is positioned adjacent coil 40 to provide a signal related to the difference in the air pressure across the outdoor coil. Contacts 95,96 marked "discharge" are those which receive a signal from thermistor 53, which signal varies as the temperature in the discharge line of the compressor. The "outdoor" contacts 97,98 are those connected to thermistor 50 which provides a signal related to the ambient temperature of the outdoor atmosphere. The mounting holes 100 indicated in the different corners of logic module board 86 facilitate the physical fastening of this component in the larger assembly (not shown). With this general perspective of the heat pump system, and particularly the employment of logic module 30 in connection with the thermostat and electro-mechanical components, a general description of the present invention will now be set out.

General Arrangement of the Invention

Figure 5:
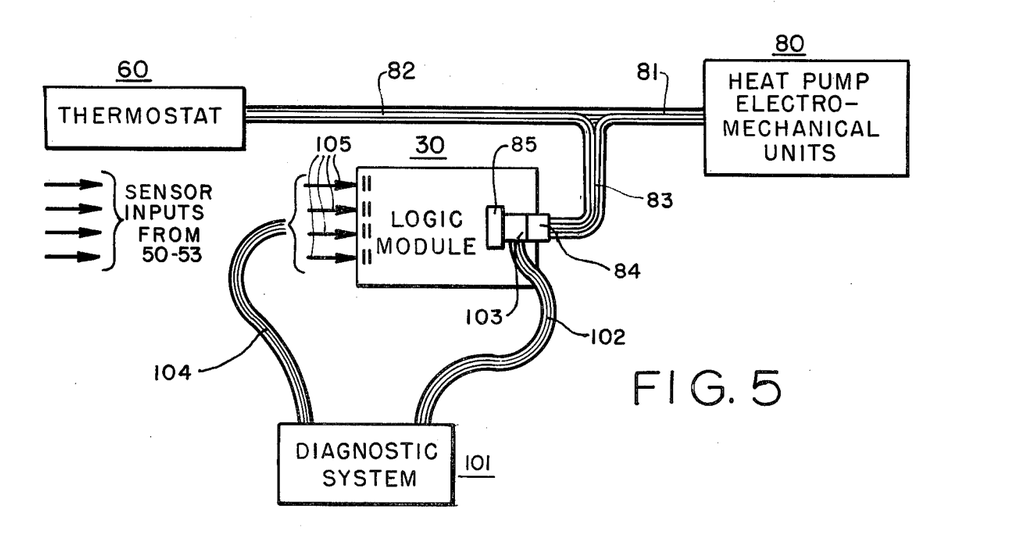
FIG. 5 is a block diagram of a diagnostic system of this invention intercoupled with the thermostat, logic module and heat pump electro-mechanical components.

Particularly in accordance with the present invention, FIG. 5 shows a diagnostic system 101, sometimes termed an analyzer herein, provided for electrical intercoupling with the logic module 30. That is, diagnostic system 101 includes a first electrical interconnection means, shown as a cable 102 and a plug 103, constructed for coupling between the first set of electrical contacts in receptacle 85 of the logic module and the heat pump system interconnecting wiring in cable 83. Those skilled in the art will appreciate that a control voltage is applied over conductors 66,67 to the logic module as shown in FIG. 2, and the same control voltage is translated over the conductors within cable 83. Thus when plug 103 is interposed between the plug 84 and receptacle 85, this same control voltage is applied over the conductors in cable 102 to the diagnostic system 101. This means that there need not be a separate power supply, whether internal or external, for the analyzer 101.

As described above in connection with FIG. 4, the contact pairs 91-98 comprise a second set of electrical contacts for receiving input signals from the sensors 50-53 shown in FIG. 2. In accordance with another important feature of the invention, diagnostic system 101 comprises a second electrical interconnection means, depicted as a cable 104 and a plurality of connectors represented generally by the arrows 105, for coupling to the second set of electrical contacts in the logic module 30. It is thus evident that the analyzer 101 can be simply and rapidly interconnected with the components in logic module 30 to check the heat pump electro-mechanical units, operation of the thermostat, and the integrity of the wiring between the thermostat, heat pump units and the logic module. A more detailed exposition of the diagnostic system and its explanation will now be set out.

DETAILED DESCRIPTION OF THE INVENTION

Figure 6:
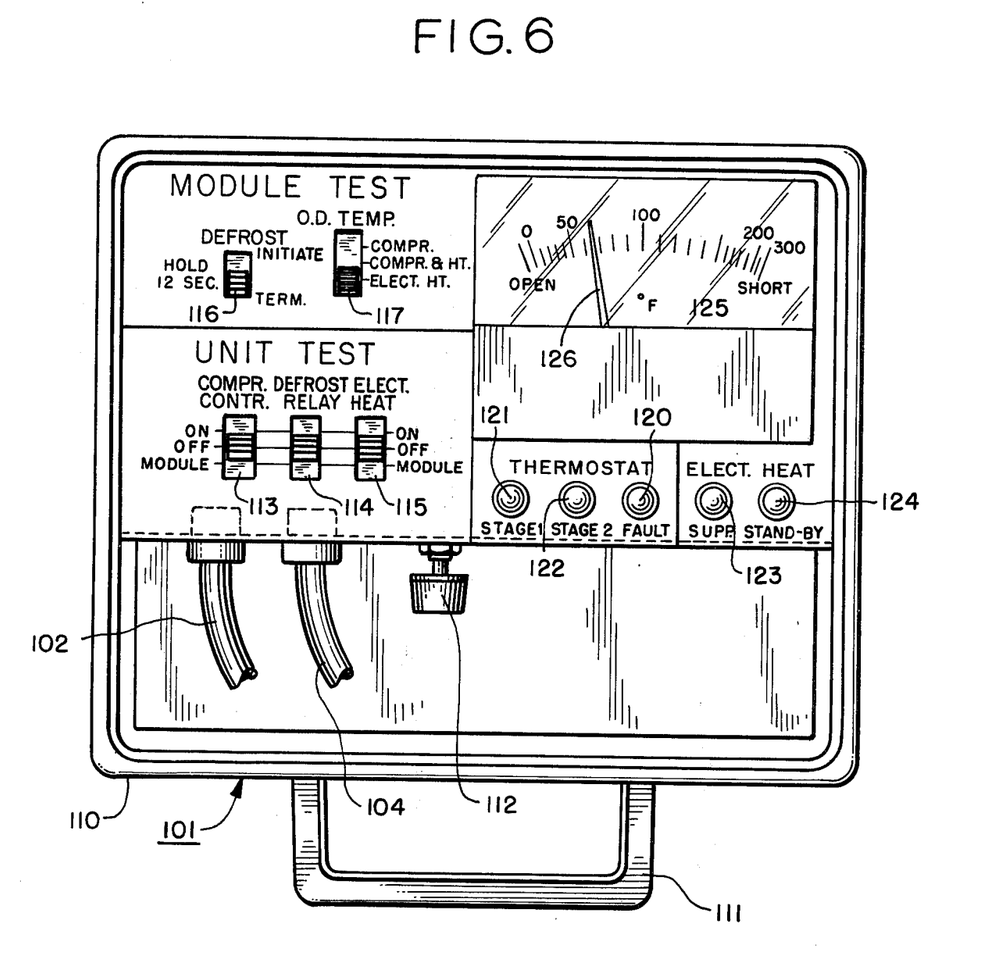
FIG. 6 is a top view of a diagnostic system contained in a carrying case according to this invention.

FIG. 6 is a top view of the diagnostic system 101 encased within a plastic briefcase-type package 110, and having a handle 111 affixed to the casing. Not shown is the top cover portion which can readily be attached to the lower case 110 to close the analyzer package, protecting all the components from dust and inadvertent damage. The cables 102,104 shown in FIG. 6 are the same interconnecting means depicted generally in FIG. 5.

In general the analyzer includes two different test areas with switches for initiating component or module tests, three separte indicating areas, and a zero-adjust knob 112. In the first test area, designated "UNIT TEST", three separate three-position switches 113, 114, and 115 are shown. Each of these switches has an on, off, and a module position. Switch 113 is connected to regulate the compressor contactor (control relay) 61, switch 114 governs the defrost relay 62, and switch 115 regulates the electric heat components 63-65. For all three switches, in the on position the component indicated by the legend above the switch will be energized regardless of the output from logic module 30. In the off position of any of the switches 113-115, the associated component will not be energized, irrespective of any signal from logic module 30. In the "module" position of any of the switches 113-115, the component indicated by the legend above the respective switch will be controlled by the signal output from the logic module 30.

in the "MODULE TEST" portion of the analyzer is a defrost switch 116, which is a two-position switch, and a three-position "O.D. TEMP." (outdoor temperature) switch 117. Switch 116 is a spring-loaded switch so that the actuator is generally in the "TERM." position as shown, denoting termination of the defrost cycle. When moved upwardly into the "INITIATE" position and held for approximately 12 seconds, a liquid line temperature below 39° F. will be simulated and the defrost switch will be closed. The unit should then go into the defrost cycle within 15 seconds. When the spring-loaded switch 116 is released, this simulates a liquid line temperature above 75° F. and, in effect, opens the defrost switch. The defrost cycle should then be terminated immediately. If a second defrost cycle is attempted to be initiated within five minutes of the time from which the first defrost cycle was initiated, the system should lock out, and should illuminate the fault light on the thermostat.

If switch 117 is moved to the uppermost position, this simulates an ambient temperature above the balance point setting and should result in compressor-only operation. If switch 117 is moved to the intermediate position, denoting compressor and heat, this simulates an ambient condition below the balance point setting but above −10° F.; this should provide for operation of the compressor, and, in addition, supplemental electric heat (stage 2 of the room thermostat must be closed). When switch 117 is moved to the lowermost position, signifying only electric heat, this simulates an ambient condition below −10° F., and thus brings on both the supplemental and standby electric heat, with the compressor off.

In the "THERMOSTAT" indicating section of the diagnostic system, there are three indicator lights 120, 121, and 122. Illumination of light 120 denotes the fault condition of the thermostat, energization of light 121 indicates the stage 1 of the thermostat is closed, and energization of light 122 signifies that stage 2 is closed. In the "ELECTRIC HEAT" portion are two additional lamps 123 and 124. As indicated by the legends below these lamps, the energization of the supplemental heat and standby heating elements are denoted by illumination of the lamps 123 and 124, respectively.

Above the THERMOSTAT and ELECTRIC HEAT portions is an ohmmeter 125. In addition to the conventional indications of "open" and "short", there is a scale of approximately 0 to 300° F. indicated on the face of the ohmmeter scale. In accordance with an important aspect of the present invention, the selective coupling of the ohmmeter movement to different ones of the electrical connector pairs 91,92 through 97,98 can provide intelligence to the serviceman using the diagnostic system, in a manner that will be described more fully herinafter. With this general perspective of the diagnostic system as a whole, a detailed electrical showing of the components and switches will now be set out.

Figure 7:
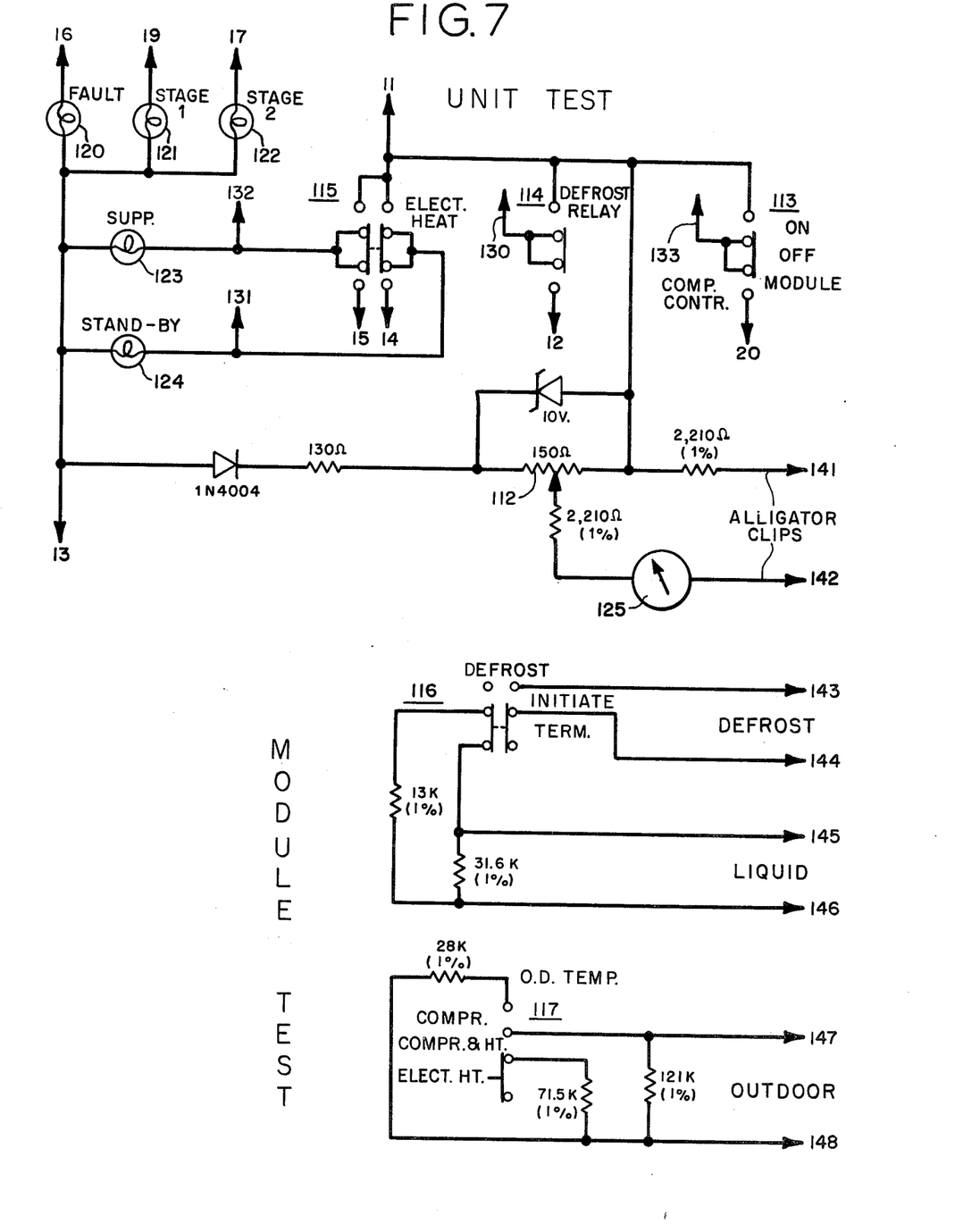
FIG. 7 is a schematic diagram of a diagnostic system constructed according to this invention.

FIG. 7 is a schematic representation of the various switches, indicator lamps and the ohmmeter shown in physical form in FIG. 6. In the upper portion of FIG. 7 are the various switches in the UNIT TEST portion of the analyzer, together with the indicator lamps 120-124 and the ohmmeter 125. The reference numerals 11-20 correspond to the same numerals in the logic module 30 in FIG. 2. Thus it will be apparent that the control voltage which is applied between conductors 66,67 appears across terminals 11,13 of the logic module, and hence across those same terminals in the circuit of FIG. 7. The additional reference numerals 130-133 will assist those skilled in the art to correlate the showing of FIG. 7 with the exact connections of the interconnecting plug 103 shown generally in FIG. 5 and in schematic detail in FIG. 8. With these connections thus detailed, and the values and circuit identifications for the components set out in FIG. 7, construction and operation of the best mode of the invention now known is readily apparent. In FIG. 7 each of the switches 113-115 is depicted in the "off" position, similar to the showing in FIg. 6.

In the lower portion of FIG. 7 the DEFROST and O.D. TEMP. switches 116,117 are shown in the same electrical circuit positions as they are mechanically shown in the MODULE TEST area in the upper left portion of FIG. 6. The reference numerals 141-148 depict the electrical connections in the second cable 104, shown generally in FIG. 5 and in more detail in FIG. 9.

Figure 8:
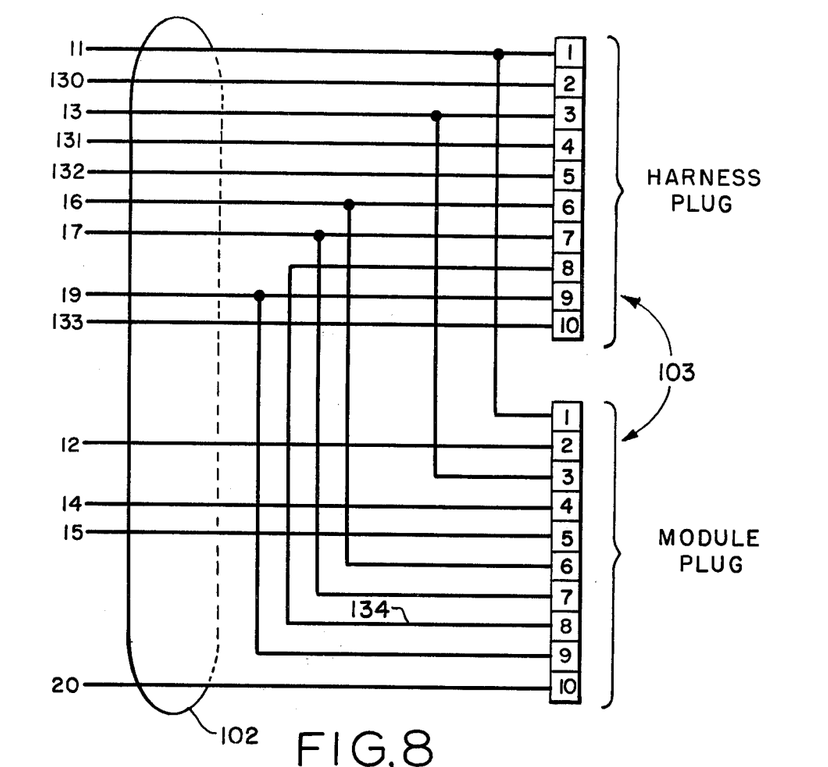
FIG. 8 is a schematic diagram depicting a first interconnecting unit.

FIG. 8 indicates the connections from the UNIT TEST area in the upper portion of FIG. 7 which are extended over the individual conductors in cable 102 and terminate in plug 103. The reference numerals at the left side of FIG. 8 identify the conductors with the corresponding connections in FIG. 7. The module plug portion has 10 hollow connectors for insertion over the corresponding pin connectors in plug 85 (FIG. 4), and the harness plug has 10 pin connectors which correspond in size and location to the pin connectors in plug 85. This allows the connector 103 of the diagnostic system to be interposed between the connections in connector 85 of the logic module and the electrical connections in the plug assembly 84 which carries the connections to the thermostat and to the heat pump electro-mechanical units. It is noted that in FIG. 8 conductor 134 provides a straightthrough connection from the module plug to the harness plug, but all the other terminals have an external connection to the circuit of the analyzer as shown in FIG. 7.

Figure 9:
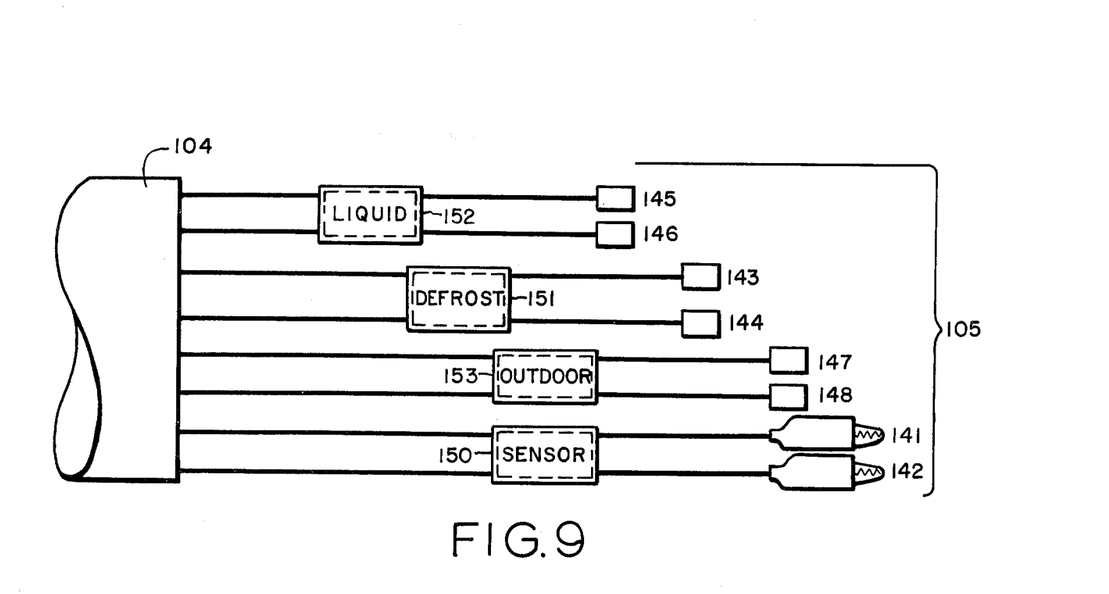
FIG. 9 is a schematic diagram depicting a second interconnecting unit for intercoupling the diagnostic system of this invention with the logic module.

FIG. 9 indicates the termination of the conductors within the second cable 104, which extends from the diagnostic system to the logic module. The leads from the circuit of ohmmeter 125 are designated with a "sensor" tag 150, and these leads are terminated in alligator clips 141,142 which facilitate the connection of the ohmmeter to different ones of the connector pairs shown on the left side of logic module 30 in FIG. 4. The other conductor pairs terminate in push-on connectors 143-148, and similar identification tags 151-153 are provided to insure the accuracy of the interconnection of these conductors with the corresponding connections along the left side of the logic module. With this delineation of the analyzer especially in connection with the explanation of FIGS. 6-9, the method of diagnostic testing will now be set out.

To diagnose any malfunction in the system shown generally in FIG. 3, the main power connection (not shown) to the heat pump outdoor unit is first disconnected. The connector plug 84 is then removed from its connection with the receptacle 85 on the logic module, and the harness plug 103 (FIG. 5) is connected into the receptacle 85. Connector 84 is then plugged into the complementary portion of connector 103. The sensor inputs from the liquid, defrost, and outdoor leads are disconnected, and the leads at the extremities of cable 104 are then connected to the corresponding contact pairs shown along the left margin of logic module 30 (FIG. 4). Although not shown in the simple overview of FIGS. 1 and 2, there is an over-ride plug which can be simply inserted into the logic module to shorten the time of the five-minute timer to only a few seconds. This allows the serviceman to check the system out, without waiting for the five-minute time duration during each analytical sequence. In the above-identified application, this over-ride plug is represented as a simple switch S1 (FIG. 3b) for shorting out resistors R58, R59 in the timer circuit including stages IC5A and IC5B. After these connections are made, and a check to make certain there are no loose wires (other than the sensor leads with the alligator clips 141,142), then the normal line voltage is restored to the outdoor unit, providing the control voltage over lines 66,67 to the thermostat, logic module, electro-mechanical units and diagnostic system itself.

Initially, to check the electro-mechanical units, the switches 113-115 in the UNIT TEST area of the analyzer will be actuated. Initially these switches are all in the OFF position. In the MODULE TEST area, defrost switch 116 is in the TERM. position, and outdoor temperature switch 117 is in the COMPR. (compressor) position. At this time both the electric heat lamps 123,124 should not be lighted, the fault light 120 should be off, and both the stage 1 lamp 121 and the stage lamp 122 should be illuminated. By displacing switch 113 to the ON position, the compressor should be started immediately with no time delay, with the heat pump system in the heating cycle. If this does not occur, there could be a faulty contactor, a defect in the relay or the compressor itself, a fault in the high pressure switch, or in the thermostat or thermostat wiring. At this time the thermostat, still set in the heat mode, is adjusted to a setting 5° above the space temperature. Fan motor 41 should be on at this time. Then defrost relay switch 114 is displaced to the ON position, which should energize reversing valve 38 and de-energize outdoor fan motor 41. If this does not occur the defrost relay should be checked, as should the solenoid for reversing valve 38, and the interconnecting wiring.

Next the switches 113,114 are returned to the OFF position, and electric heat lamps 123,124 should be illuminated, showing that the heat pump system is off and both the electric heat stages are energized. If this does not occur the thermostat and the electric heat wiring circuits should be checked.

To check the sensors, all the switches are placed in the same positions noted at the beginning of the electromechanical component test, the thermostat is at the same setting with the outdoor fan on, and only the thermostat stage 1 and stage 2 lamps 121, 122 are illuminated. The alligator clip leads 141,142 are shorted together, and the zero-adjust knob 112 is displaced to vary the value of the 150 ohm potentiometer shown in FIG. 7 until the pointer 126 on meter 125 coincides with the "short" index at the right of the meter scale. The alligator clips are then removed from their mutual connection, and individually connected to the "outdoor" connectors 97,98 on the logic module. With this connection the ohmmeter pointer 126 should be deflected to a temperature near the ambient temperature. If this does not occur sensor 50 may be open, shorted, or out of calibration.

Switch 113 is now moved to the ON position, and the alligator clips 141,142 are then removed and attached to the "liquid" terminals 91,92. At this time the reading on ohmmeter 125 should be that of the temperature in liquid line 47, as provided by thermistor 52. A similar check for thermistor 53 is made by attaching the alligator clips to the "discharge" terminals 95,96. Appropriate data for the temperature in liquid line 47, and the pressure in the discharge line from the compressor is provided the serviceman. If th reading on meter 125 does not approximate this data, the sensor 52 or 53 may be opened, shorted, out of calibration or improperly mounted.

To check the components in logic module 30, switch 113 is returned to the OFF position, and thus at this time the compressor stops. The serviceman should wait about two minutes before the next step, to allow the system components to stabilize. Then all of the unit test switches 113,114, and 115 are displaced downwardly to the MODULE position, while the module test switches 116,117 remain in the positions illustrated in FIG. 6. At this time the compressor should start with the heat pump system in the heating cycle, and reversing valve 38 is de-energized. If this does not occur, there may be faulty wiring, or a defect in the thermostat or the logic module.

Next the defrost switch 116 should be displaced upwardly against the spring bias and held in the INITIATE position to commence a defrost cycle. This defrost cycle should be commenced within 12 seconds, and in any event switch 116 should be released before 60 seconds. When the defrost cycle is commenced, reversing valve 38 is energized and outdoor fan motor 41 is de-energized. If this does not occur, the wiring may be defective, or there may be a fault in the defrost relay or the logic module.

The defrost switch is now in the TERM. position, and the outdoor temperature switch 117 is displaced to its center position, to bring on both the compressor and the electric heat. The thermostat lamps 121,122 should remain energized and, in addition, lamp 123 should come on to indicate energization of the supplementary electric heat. Both the compressor and the supplementary heat should now be on; if they are not, the supplementary heat circuit, the logic module, and the interconnecting wiring should be checked.

Next the outdoor temperature switch 117 is displaced to the ELECT. HT. position, bringing on all the electric heat and de-energizing the compressor. Lamp 124 should be illuminated (while lamp 123 also remains on) to show all the electric heat is now on. If this does not occur, the wiring should be checked for faults, as should the electric heat components and the logic module itself. At this time all the unit test switches 113-115 are returned to the OFF Position, defrost switch 116 remains in the terminate position, and the outdoor temperature switch 117 is returned to the compressor position. Lamps 123,124 are extinguished and only the lamps 121,122 remain on. Again a two minute interval is allowed so that the system components can stabilize under these conditions. Then the thermostat is set in the "cool" mode, and adjusted to a setting 2° below the space temperature with the outdoor fan on. Lamp 122 should be extinguished and only lamp 121 should remain on. all the unit test switches 113-115 are then displaced to the MODULE position. The compressor should then start within about 12-15 seconds, with the system in the cooling cycle, and the reversing valve energized. If this does not occur then the wiring should be checked for faults, as should the thermostat and the logic module.

Technical Advantages

From the foregoing it is manifest that the present invention provides a diagnostic system which rapidly and accurately detects any system malfunctions. The diagnostic system is effective whether the fault is in the first installation of the heat pump arrangement, or whether it occurs in subsequent component wear or system component failutre. All the system checks can be made from the location of the logic module, by simple connection of the leads from two main cables extending from the analyzer. The analyzer does not require a separate power supply, in that it draws power from the same control voltage conductors over which energy is normally supplied from the main power line connections to the thermostat, logic module, and electro-mechanical units. Thus it is apparent that by placing the diagnostic equipment within a compact, unitary carrying case, even relatively inexperienced servicemen can follow the diagnostic procedures set out above and rapidly detect the source of any heat pump malfunction.

In the appended claims the term "connected" means a d-c connection between two components with virtually zero d-c resistance between those components. The term "coupled" indicates there is a functional relationship between two components, with the possible interposition of other elements between the two components described as "coupled" or "intercoupled".

While only a particular embodiment of the invention has been described and claimed herein, it is apparent that various modifications and alterations of the invention may be made. It is therefore the intention in the appended claims to cover all such modifications and alterations as may fall within the true spirit and scope of the invention.

What is claimed is:

1. A diagnostic system for use with environmental control apparatus including a heat pump having electro-mechanical units, a thermostat, and a logic module having a first set of electrical contacts coupled over interconnecting wiring both to the thermostat and the electro-mechanical units, which diagnostic system comprises:

electrical interconnection means, constructed for coupling between said first set of electrical contacts and said interconnecting wiring, and a plurality of indicator lamps coupled to said interconnection means, illumination of the lamps indicating the status of the thermostat and the interconnecting wiring between the thermostat and the logic module.

2. A diagnostic system for use with environmental control apparatus as claimed in claim 1, in which the apparatus further comprises at least one stage of supplementary electric heat for energization under the control of the heat pump logic module, and said diagnostic system comprises at least one additional indicator lamp coupled to said electrical interconnection means, which additional lamp is illuminated to indicate energization of the supplementary electric heat stage.

3. A diagnostic system for use with environmental control apparatus as claimed in claim 2, and in which a standby electric heating unit is also regulated by the logic module, and the diagnostic system comprises a second indicator lamp also coupled to said electrical interconnection means, which second lamp is illuminated to indicate energization of the standby electic heating unit.

4. A diagnostic system for use with environmental control apparatus as claimed in claim 1, in which said diagnostic system further comprises a plurality of multi-position switches intercoupled with said electrical interconnection means, selective actuation of said switches being effective to selectively energize individual ones of the electro-mechanical units in the heat pump.

5. A diagnostic system for use with environmental control apparatus as claimed in claim 4, in which each of said multi-position switches has a neutral position in which control signals from the logic module are translated directly through the diagnostic system to the electro-mechanical units, a second position in which a control signal generated in the diagnostic system energizes a selected electro-mechanical unit, and a third position in which energization of the selected electro-mechanical unit is prevented, thus effecting a check of the operation of such electro-mechanical units.

6. A diagnostic system for use with environmental control apparatus as claimed in claim 1, in which said logic module further comprises a second set of electrical contacts for receiving sensor input signals, and said diagnostic system further comprises a second electrical interconnection means, constructed for coupling to said second set of electrical contacts, and an ohmmeter, coupled to said second electrical interconnection means, operable to display a resistance value of the component coupled to any contact pair and having indicia interpreting such resistance value as a temperature indication.

7. A diagnostic system as claimed in claim 6, in which the heat pump system includes an outdoor coil and a pair of sensors for providing signals related to the pressure difference across the outdoor coil and the temperature in a liquid line coupled to the outdoor coil, which signals are applied to certain of the second set of electrical contacts in the logic module, and the diagnostic system includes a switch for coupling to said certain electrical contacts, actuation of said switch being effective to initiate and to terminate a defrost cycle of the heat pump.

8. A diagnostic system as claimed in claim 6, in which the heat pump system includes a compressor, electrical heat components and a sensor for providing a signal related to the outdoor temperature, which signal is applied to certain of the second set of electrical contacts in the logic module, and the diagnostic system includes a switch for coupling to said certain electrical contacts, actuation of the switch being effective to regulate operation only of the compressor, only of the electric heat, or both the compressor and electic heat in the heat pump system.

9. An analyzer for use with a heat pump system having electro-mechanical units including a compressor controlled by a compressor relay, a reversing valve and an outdoor coil fan motor both controlled by a defrost relay, and at least a first electric heat unit, a thermostat, and a logic module having a first set of electrical contacts terminating in a receptacle which is coupled over a first cable to the thermostat, to both relays and to the electric heat unit, which analyzer comprises:

an electrical connector, constructed for insertion between the receptacle and the first cable, and a plurality of indicator lamps coupled to said connector, illumination of the lamps indicating the status of the thermostat and the interconnecting wiring between the thermostat, logic module, relays and heat unit.

10. An analyzer as claimed in claim 9, for use with a heat pump, in which the heat pump further comprises a second electric heat unit for energization under the control of the heat pump logic module, and the analyzer comprises at least one additional indicator lamp which is illuminated to indicate energization of the second electric heat unit.

11. An analyzer for use with a heap pump as claimed in claim 9, in which said analyzer further comprises three switches intercoupled with said first cable, selective actuation of said switches being effective to selectively energize individual ones of the electro-mechanical units including the relays and the electric heat unit.

12. An analyzer for use with a heat pump as claimed in claim 11, in which each of said switches has a neutral position in which control signals from the logic module are translated directly through the analyzer to one of the electro-mechanical units, a second position in which a control signal generated in the analyzer energizes a selected electro-mechanical unit, and a third position in which energization of the selected electro-mechanical unit is prevented, thus effecting a check of the operation of such electro-mechanical units.

13. An analyzer for ue with a heat pump as claimed in claim 9, in which said logic module further comprises a second set of electrical contacts for receiving sensor input signals, and said analyzer further comprises a plurality of electrical connector pairs, constructed for coupling to said second set of electrical contacts, and an ohmmeter, coupled to one of the connector pairs, operable to display a resistance value of the component coupled to the one connector pair and having indicia interpreting such resistance value as a temperature indication.

14. An analyzer as claimed in claim 13, in which the heat pump system includes an outdoor coil and a pair of sensors for providing signals related to the pressure difference across the outdoor coil and the temperature in a liquid line coupled to the outdoor coil, which signals are applied to certain of the second set of electrical contacts in the logic module, and the analyzer includes a switch for coupling over certain of said connector pairs to said certain electrical contacts, actuation of said switch being effective to initiate and to terminate a defrost cycle of the heat pump.

15. An analyzer as claimed in claim 13, in which the heat pump system includes a compressor, electrical heat components and a sensor for providing a signal related to the outdoor temperature, which signal is applied to a different pair of the second set of electrical contacts in the logic module, and the analyzer includes a switch for coupling to said different pair of the connectors, actuation of the switch being effective to regulate operation only of the compressor, only of the electric heat, or both the compressor and electric heat in the heat pump system.

* * * * *